United States Patent
You et al.

(10) Patent No.: US 9,538,526 B2
(45) Date of Patent: Jan. 3, 2017

(54) METHOD AND DEVICE FOR TRANSMITTING FRAME

(75) Inventors: Hyang Sun You, Anyang-si (KR); Yong Ho Seok, Anyang-si (KR); Jong Hyun Park, Anyang-si (KR); Ill Soo Sohn, Anyang-si (KR); Eun Sun Kim, Anyang-si (KR); Ji Hyun Lee, Anyang-si (KR)

(73) Assignee: LG Electronics Inc., Seoul (KR)

( * ) Notice: Subject to any disclaimer, the term of this patent is extended or adjusted under 35 U.S.C. 154(b) by 292 days.

(21) Appl. No.: 14/241,367

(22) PCT Filed: Jun. 21, 2012

(86) PCT No.: PCT/KR2012/004896
§ 371 (c)(1),
(2), (4) Date: Feb. 26, 2014

(87) PCT Pub. No.: WO2013/032124
PCT Pub. Date: Mar. 7, 2013

(65) Prior Publication Data
US 2014/0233483 A1    Aug. 21, 2014

Related U.S. Application Data

(60) Provisional application No. 61/530,418, filed on Sep. 2, 2011.

(51) Int. Cl.
H04W 4/00       (2009.01)
H04W 72/04      (2009.01)
(Continued)

(52) U.S. Cl.
CPC ....... H04W 72/0446 (2013.01); H03M 13/353 (2013.01); H03M 13/3715 (2013.01);
(Continued)

(58) Field of Classification Search
USPC .......................................................... 370/329
See application file for complete search history.

(56) References Cited

U.S. PATENT DOCUMENTS

2005/0114489 A1* 5/2005 Yonge, III ............ H04L 1/0061
                                                        709/223
2008/0080437 A1* 4/2008 Krishnaswamy ..... H04L 1/0003
                                                        370/338
(Continued)

FOREIGN PATENT DOCUMENTS

KR    10-2009-0080551 A    7/2009

OTHER PUBLICATIONS

NPL "IEEE P802.11n/D8.0" by IEEE, dated Feb. 2009.*
(Continued)

*Primary Examiner* — Gregory Sefcheck
*Assistant Examiner* — Majid Esmaelilian
(74) *Attorney, Agent, or Firm* — Dentons US LLP

(57) ABSTRACT

Disclosed are a method and device for transmitting a frame. The method for transmitting a frame includes a step of generating A-MPDU (aggregate MAC protocol data unit) and a step of transmitting A-MPDU. The A-MPDU includes a first AMPDU subframe and a second A-MPDU subframe, wherein the first A-MPDU subframe includes a data block, and the second AMPDU subframe includes an FEC (Forward Error Correction) coding block which is additionally used in the decoding of the data block. Thus, the STA is capable of preventing unnecessary power consumption of STA by selectively determining whether FEC information is received according to whether an error occurred in the decoded data.

8 Claims, 13 Drawing Sheets

(51) Int. Cl.
*H03M 13/35* (2006.01)
*H03M 13/37* (2006.01)
*H03M 13/00* (2006.01)
*H04L 1/00* (2006.01)
*H04L 29/06* (2006.01)
*H03M 13/09* (2006.01)
*H03M 13/11* (2006.01)
*H03M 13/23* (2006.01)
*H03M 13/29* (2006.01)

(52) U.S. Cl.
CPC ...... *H03M 13/6527* (2013.01); *H04L 1/0083* (2013.01); *H04L 69/22* (2013.01); *H03M 13/09* (2013.01); *H03M 13/1102* (2013.01); *H03M 13/23* (2013.01); *H03M 13/2957* (2013.01)

(56) References Cited

U.S. PATENT DOCUMENTS

| | | | |
|---|---|---|---|
| 2008/0310414 A1* | 12/2008 | Yonge, III | H04L 12/2801 370/390 |
| 2011/0080887 A1 | 4/2011 | Krishnaswamy et al. | |
| 2011/0286544 A1* | 11/2011 | Avudainayagam | H04L 1/0009 375/295 |
| 2012/0110405 A1* | 5/2012 | Toshimitsu | H04L 1/1642 714/748 |

OTHER PUBLICATIONS

Yong Liu, et al., "A-MPDU Delimiter Changes", IEEE 802.11-10/1093r1, Sep. 12, 2010 See slide 6-slide 12.

Robert Stacey, et al., "Proposed Specification Framework edits for preamble structure and A-MPDU", IEEE 802.11-09/0992r3, Jan. 21, 2009 See p. 7, section 6.3.1.

* cited by examiner

METHOD AND DEVICE FOR TRANSMITTING FRAME

This application is a 35 USC §371 National Stage entry of International Application No. PCT/KR2012/004896 filed on Jun. 21, 2012, and claims priority of U.S. Provisional Application No. 61/530,418 filed on Sep. 2, 2011, each of which is hereby incorporated by reference in its entirety.

TECHNICAL FIELD

The present invention relates to wireless communication, and more particularly, to a method and a device for transmitting a frame.

BACKGROUND ART

In recent years, various wireless communication technologies have been developed with the development of telecommunication technologies. Among them, a wireless local area network (WLAN) is a technology that can access the Internet wirelessly at home or a company, or in a specific service providing area by using portable terminals including a personal digital assistant (PDA), a laptop computer, a portable multimedia player (PMP), and the like based on a radio frequency technology.

After Institute of Electrical and Electronics Engineers (IEEE) 802 which is a standardization organization of the WLAN technology was founded in February 1980, a lot of standardization works have been carried out. After an initial WLAN technology supported a speed of 1 to 2 Mbps through frequency hopping, band spreading, infrared communication, and the like by using a frequency at 2.4 GHz via IEEE 802.11, the WLAN technology can have supported a maximum speed of 54 Mbps by adopting orthogonal frequency division multiplex (OFDM) in recent years. Besides, in the IEEE 802.11, standards for various technologies including improvement of quality for service (QoS), access point protocol compatibility, security enhancement, radio resource measurement, a wireless access vehicular environment, fast roaming, a mesh network, interworking with an external network, wireless network management, and the like have been under commercialization or development. One of primary technologies in a communication technology using a radio resource, such as the IEEE 802.11 is a technology that corrects an error.

Forward error correction (FEC) is used as a channel coding method for correcting a bit-unit error which may occur while a signal passes through a channel. However, an error which cannot be corrected may remain in spite of correcting the error by using the FEC. Cyclic redundancy check (CRC) may be used to notify whether the error which cannot be corrected remains. Remnant bits called a frame check sequence (FCS) need to be sent from a transmitter to a receiver in order to use the CRC. It may be judged whether the error which cannot be corrected remains in data received based on the received FCS bit in the receiver.

DISCLOSURE

Technical Problem

An object of the present invention is to provide a method for transmitting a frame in a wireless LAN system.

Another object of the present invention is to provide a device that performs a method for transmitting a frame in a wireless LAN system.

Technical Solution

In accordance with an aspect of the present invention, there is a provided a method for transmitting a frame, including the steps of: generating an aggregate MAC protocol data unit (A-MPDU); and transmitting the A-MPDU, and the A-MPDU includes a first A-MPDU subframe and a second A-MPDU subframe, the first A-MPDU subframe includes a data block, and the second A-MPDU subframe includes a forward error correction (FEC) coding block additionally used to decode the data block. The first A-MPDU subframe and the second A-MPDU subframe may be subframes including an FEC MPDU indication for distinguishing the first A-MPDU subframe and the second A-MPDU subframe by using at least one bit. The FEC MPDU indication may be information indicating the first A-MPDU subframe and the second A-MPDU subframe by using one bit. The FEC MPDU indication may be information indicating the first A-MPDU subframe by using at least one bit and indicating which first A-MPDU subframe the second A-MPDU subframe includes an FEC coding block. The FEC MPDU indication may be information indicating the first A-MPDU subframe by using at least one bit and indicating which sub data block among a plurality of sub data blocks included in the first A-MPDU subframe the second A-MPDU subframe includes an FEC coding block for. The FEC MPDU indication may be information indicating the first A-MPDU subframe by using at least one bit and indicating how many redundancy information the second A-MPDU subframe is in the first A-MPDU subframe. The second A-MPDU subframe may be at least one subframe including FEC coding blocks for data blocks of k first A-MPDU subframes when the number of first A-MPDU subframes is k (k is a natural number). The second A-MPDU subframe may be a subframe including FEC coding blocks for data blocks included in k respective first A-MPDU subframes when the number of first A-MPDU subframes is k (k is the natural number). The second A-MPDU subframe may be a subframe including an FEC coding block for an n-th sub data block of the first A-MPDU subframe when the data block included in the first A-MPDU subframe is divided into n (n is the natural number) sub data blocks. The second A-MPDU subframe may be the same subframe as the first A-MPDU subframe.

In accordance with another aspect of the present invention, there is provided an AP, including: a processor generating a data block and an FEC coding block by channel-coding data and generating a first A-MPDU subframe including the data block and a second A-MPDU subframe including the FEC coding block; and a transceiver transmitting an A-MPDU frame including the first A-MPDU subframe and the second A-MPDU subframe. The second A-MPDU subframe may be at least one subframe including FEC coding blocks for data blocks of k first A-MPDU subframes when the number of first A-MPDU subframes is k (k is a natural number). The second A-MPDU subframe may be a subframe including FEC coding blocks for data blocks included in k respective first A-MPDU subframes when the number of first A-MPDU subframes is k (k is the natural number). The second A-MPDU subframe may be a subframe including an FEC coding block for an n-th sub data block of the first A-MPDU subframe when the data block included in the first A-MPDU subframe is divided into n (n is the natural number) sub data blocks. The second A-MPDU subframe may be the same subframe as the first A-MPDU subframe.

Advantageous Effects

By using a method that additionally transmits a subframe including FEC information, an STA selectively decides whether to receive the FEC information depending on occurrence of decoded data to prevent unnecessary power consumption of the STA.

MODE FOR INVENTION

A wireless local area network (WLAN) system includes one or more basic service sets (BSS). The BSS as a set of stations (STAs) that are successfully synchronized with each other to communicate with each other is not a concept that indicates a specific area.

An infrastructure BSS includes one or more non-AP stations, an AP providing a distribution service, and a distribution system DS connecting a plurality of APs. In the infrastructure BSS, the AP manages non-AP STAs of the BSS.

On the contrary, an independent BSS (IBSS) is a BSS that operates in an Ad-Hoc mode. Since the IBSS does not include the AP, the IBSS has no centralized management entity that performs a management function at the center thereof. That is, in the IBSS, the non-AP STAs are managed in a distributed manner. In the IBSS, all STAs may be constituted by mobile STAs and all of the STAs are not permitted to access a DS to constitute a self-contained network.

The STA as a predetermined functional medium including a medium access control (MAC) that follows a regulation of an Institute of Electrical and Electronics Engineers (IEEE) 802.11 standard and a physical layer interface for a radio medium may be used as a meaning that the STA includes both the AP and the non-AP station as a broad sense.

The STA may also be called a mobile terminal, a wireless device, a wireless transmit/receive unit (WTRU), use equipment (UE), a mobile station (MS), a mobile subscriber unit or other names such as a user, and the like. The medium access control (MAC) of the STA and the physical layer interface for the radio medium are defined in the IEEE 802.11 standard.

Figure 1:
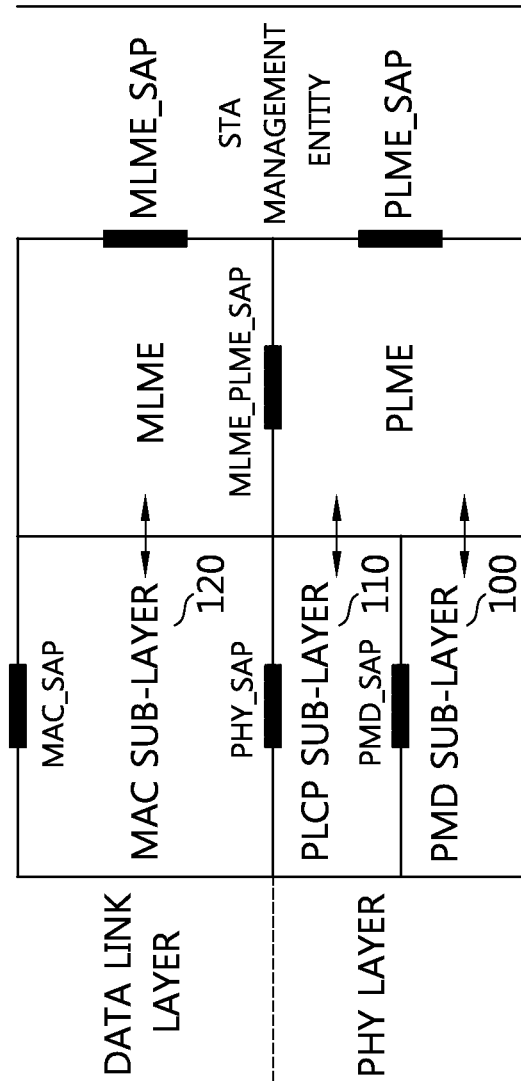
FIG. 1 is a diagram illustrating a layer architecture of a wireless LAN system supported by IEEE 802.11.

FIG. 1 is a diagram illustrating a layer architecture of a wireless LAN system supported by IEEE 802.11.

A physical layer (PHY) architecture of the IEEE 802.11 may include a PHY layer management entity (PLME), a physical layer convergence procedure (PLCP) sub-layer 110, and a physical medium dependent (PMD) sub-layer 100. The PLME may provide a management function of a physical layer in cooperation with an MAC layer management entity (MLME). The PLCP sub-layer 110 transfers to the PMD sub-layer 100 an MAC protocol data unit (MPDU) received from the MAC sub-layer 120 according to an instruction of an MAC layer between the MAC sub-layer 120 and the PMD sub-layer 100 or transfers to the MAC sub-layer 120 a frame received from the PMD sub-layer 100. The PMD sub-layer 100 as a PLCP lower layer enables a physical layer entity to be transmitted and received between two stations through the radium medium. The MAC protocol data unit (MPDU) transferred by the MAC sub-layer 120 is called a physical service data unit (PSDU) in the PLCP sub-layer 110. The MPDU is similar to the PSDU, but when an aggregated MPDU (A-MPDU) acquired by aggregating a plurality of MPDUs is transferred, individual MPDUs and PSDU may be different from each other. Hereinafter, in the method for transmitting a frame according to an embodiment of the present invention, a method for transmitting an A-MPDU frame will be described in detail.

The PLCP sub-layer 110 adds an addition field including required information by a physical layer transceiver while receiving the PSDU from the MAC sub-layer 120 and transferring the received PSDU to the PMD sub-layer 100. In this case, the added field may be may be a PLCP preamble in the PSDU, a PLCP header, a tail bit required to restore an convolution encoder to a zero state, and the like. The PLCP preamble may serve to allow the receiver to perform a synchronization function and prepare antenna diversity before the PSDU is transmitted. A data field may include padding bits, a service field including a bit sequence for initializing a scrambler, and a coded sequence acquired by encoding the bit sequence added with the tail bits. In this case, one of binary convolutional coding (BCC) encoding and low density parity check (LDPC) encoding may be selected according to an encoding scheme supported by an STA that receives a PPDU. The PLCP header may include a field including information on the PLCP protocol data unit (PPDU) to be transmitted.

The PLCP sub-layer 110 generates the PLCP protocol data unit (PPDU) by adding the aforementioned field to the PSDU and transmits the generated PPDU to a receiving station through the PMD sub-layer 100 and the receiving station acquires and restores information required for restoring data from the PLCP preamble and the PLCP header.

Figure 2:
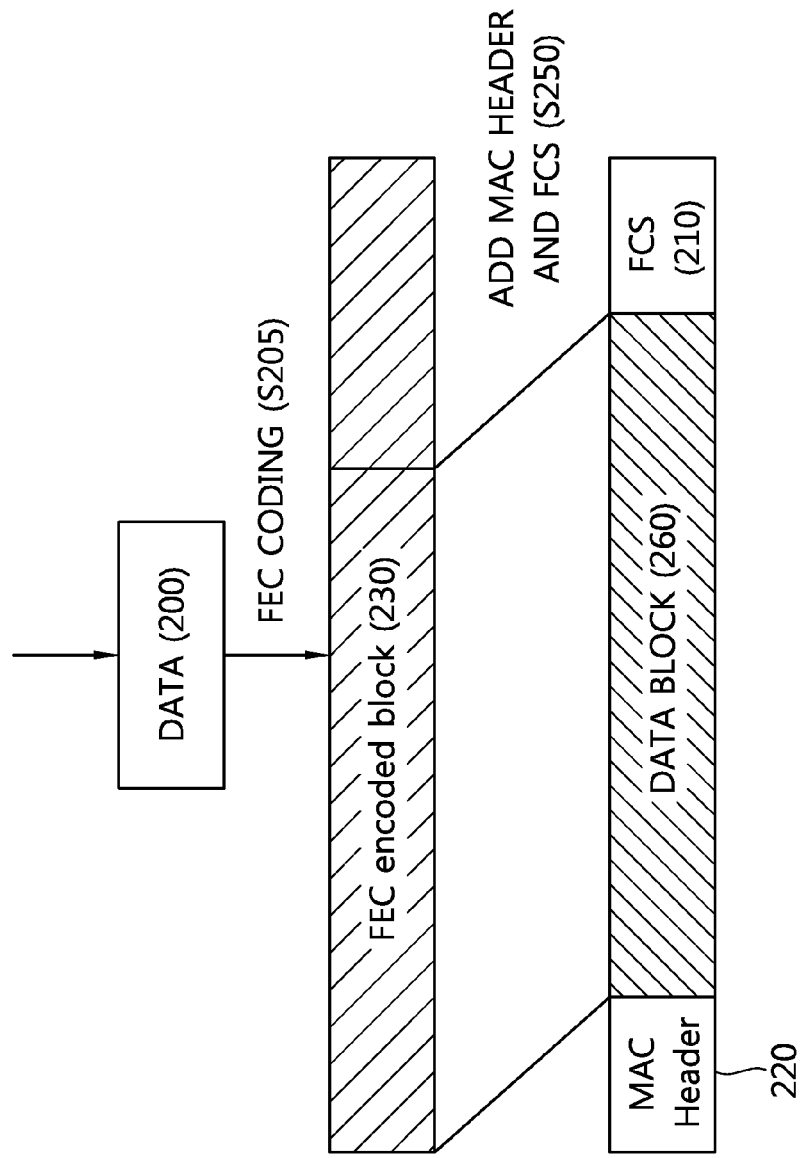
FIG. 2 is a conceptual diagram illustrating a part of a process of generating an MPDU by using forward error correction (FEC) in an MAC layer.

FIG. 2 is a conceptual diagram illustrating a part of a process of generating an MPDU by using forward error correction (FEC) in an MAC layer.

Referring to FIG. 2, the MAC layer performs channel coding of transmitted data 200 (step S205).

As a channel coding method performed in the MAC layer, various methods may be used. For example, when turbo coding is performed as the channel coding method, convolutional channel coding having predetermined coding rate (for example, ⅓) may be performed.

A block that performs the channel coding may be defined as a terminology called an FEC encoded block 230. All or some blocks of the FEC encoded blocks 230 may be transmitted to the PHY layer. The FEC encoded block 230 transmitted to the PHY layer may be defined as a terminology called a coding block 260.

An MAC header 220 and a frame check sequence (FCS) 210 are added (step S250).

A frame including the coding block 260, the MAC header 220, and the FCS 210 may be transmitted from the MAC layer to the PHY layer as one transmission unit.

When such a channel coding method is used, a transmitter may transmit all or some of the FEC encoded blocks 230 to the coding block 260. In the case of the FEC encoded block 230, when a channel state is good, an error may not occur and in this case, even though some FEC encoded blocks 230 are received, the FEC encoded blocks 230 may be decoded without an error in the STA. Therefore, when the channel state is good, the coding block 260 that transmits all or most of the FEC encoded blocks 230 may include unnecessarily a lot of error correction information. When the STA receives all of the FEC encoded blocks 230 including the unnecessarily a lot of error correction information, unnecessary power consumption occurs to receive the correction information at the receiver.

The same problem may occur even with respect to the A-MPDU frame in which the MPDU is aggregated and transmitted.

Figure 3:
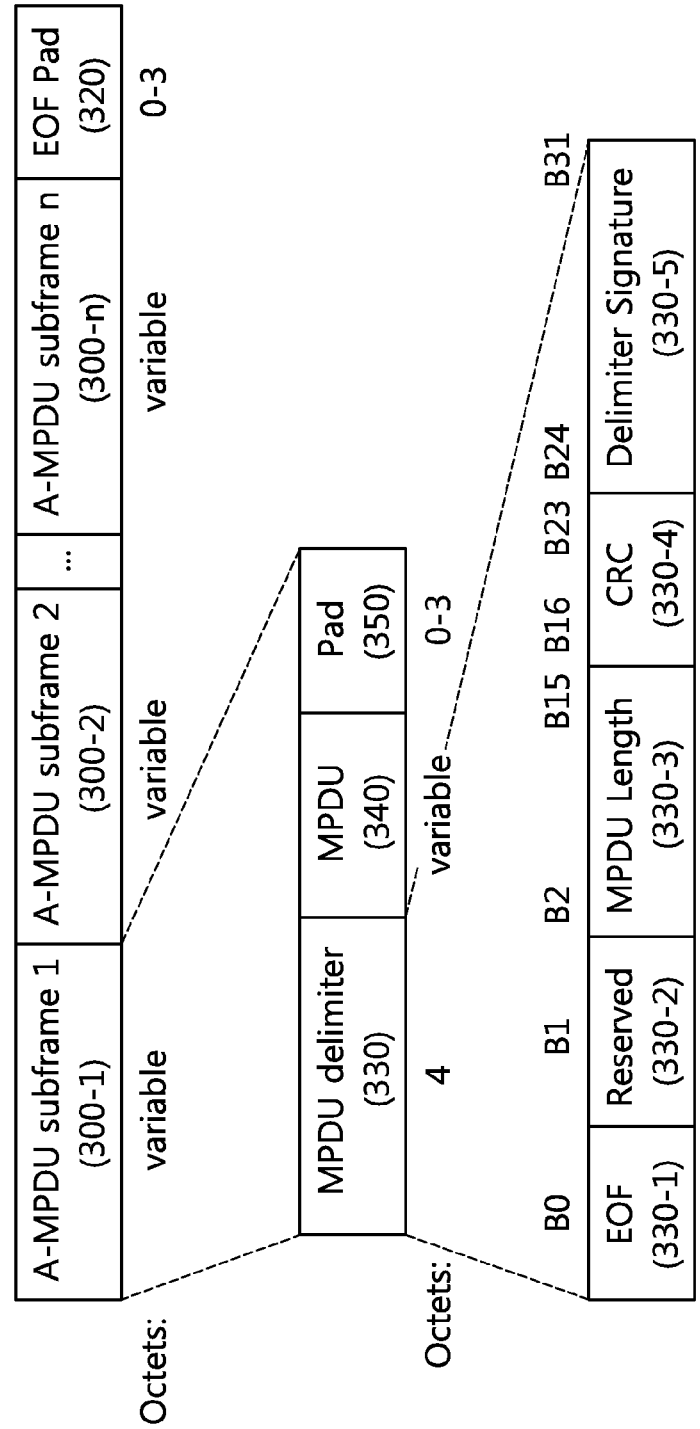
FIG. 3 is a conceptual diagram illustrating an aggregate MPDU (A-MPDU) frame and an A-MPDU subframe in the related art.

FIG. 3 is a conceptual diagram illustrating an aggregate MPDU (A-MPDU) frame and an A-MPDU subframe in the related art.

In the MAC layer, the A-MPDU frame may be generated by aggregating a plurality of MPDU frames in order to generate one PPDU based on the plurality of MPDU frames.

Referring to FIG. 3, the A-MPDU frame 300 may include at least one A-MPDU subframe 300-1, 300-2, . . . , 300-n and an EOF pad 320 having an octet length of 0 to 3.

The A-MPDU frame 300 as a structure including the plurality of MAC protocol data units (MPDUs) is a frame having a structure in which the A-MPDU frame 300 may be transmitted as one PLCP service data unit (PSDU) when being transmitted to the physical layer.

The A-MPDU subframe 300-1, 300-2, . . . , 300-n may include an MPDU delimiter 330, an MPDU 340, and a pad 350, and herein, the MPDU delimiter 330 may include EOF 330-1, Reserved 330-2, MPDU Length 330-3, CRC 330-4, and Delimiter Signature 330-5.

The A-MPDU frame and information on respective fields included in the A-MPDU frame disclosed in FIG. 3 are defined in Clause 8.6 of IEEE draft 802.11ac D1.0. Hereinafter, a field used in the A-MPDU which is not additionally described used in the embodiment of the present invention may be analyzed as the same meaning as a field described in a structure of an A-MPDU frame defined in Clause 8.6 of IEEE P802.11ac/D1.0 "Part 11: Wireless LAN Medium Access Control (MAC) and Physical Layer (PHY) specifications: Amendment 5: Enhancements for Very High Throughput for Operation in Bands below 6 GHz" (hereinafter, referred to as "802.11ac") disclosed in May 2011.

Even in the case of the A-MPDU frame in the related art, the respective MPDUs 340 included in the A-MPDU subframes 300-1, 300-2, . . . , 300-n may include unnecessarily a lot of error correction information.

That is, even when an error does not occur in data of the MPDU 340 because of a good environment, the STA needs to transmit a coding block in which the error correction information is added in the data. Accordingly, consumption of power of the STA required to unnecessary data may be increased.

In order to solve the problem described in FIGS. 2 and 3, hereinafter, the present invention discloses an A-MPDU frame structure for preventing unnecessary error correction information from being received when no error occurs in the A-MPDU frame.

Hereinafter, the channel coding used in the embodiment of the present invention may be used as the same meaning as the FEC and the error correction information may be used as the same meaning as a parity bit generated by performing the FEC.

Figure 4:
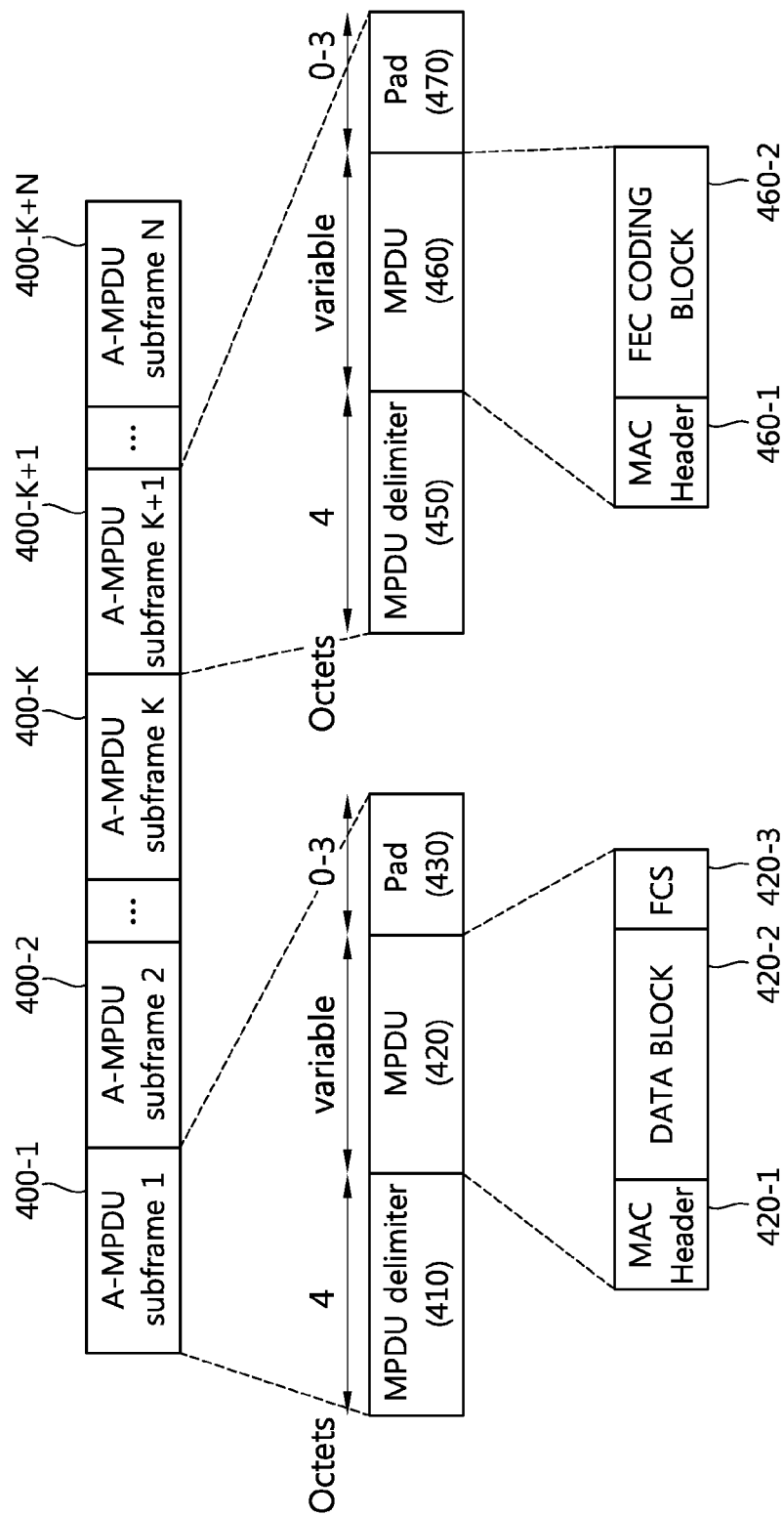
FIG. 4 is a conceptual diagram illustrating a method for generating an A-MPDU frame according to an embodiment of the present invention.

FIG. 4 is a conceptual diagram illustrating a method for generating an A-MPDU frame according to an embodiment of the present invention.

Referring to FIG. 4, the A-MPDU frame may include two A-MPDU subframes and one A-MPDU subframe is a subframe including a data block 420-2 and the other one A-MPDU subframe may be a subframe including an FEC coding block 460-2 which is additionally used.

The data block 420-2 of FIG. 4 may be a block having a minimum size to restore data 200 of FIG. 2 in the FEC encoded block or a block including only the actual data 200 of FIG. 2 unlike the coding block 260 described in FIG. 2. The FEC coding block 460-2 may be a block including additional error correction information, which enables decoding without an error by additional transmission when decoding is impossible only by the data block 420-2.

Hereinafter, a subframe including the data block 420-2 is defined as a first A-MPDU subframe and a subframe including the FEC coding block 460-2 is defined as a second A-MPDU subframe.

The first A-MPDU subframes 400-1, 400-2, . . . , 400-k may include an MPDU delimiter 410, an MPDU 420, and a Pad 430 and the MPDU 420 may include an MAC header 420-1, a data block 420-2, and an FCS 420-3 again.

The second A-MPDU subframes 400-K+1, . . . , 400-N as one independent subframe may include an MPDU delimiter 450, an MPDU 460, and a Pad 470 similarly as the first A-MPDU subframes 400-1, 400-2, . . . , 400-k, and the MPDU 460 may include an MAC header 460-1 and an FEC coding block 460-2 again.

In the method and the device for transmitting a frame according to the embodiments of the present invention, the receiver STA may restore data by performing decoding with the received first A-MPDU subframes 400-1, 400-2, . . . , 400-k. When an error occurs in data with performing the decoding, the error may be corrected based on the FEC coding block information included in the second A-MPDU subframes 400-K+1, . . . , 400-N by additionally receiving the second A-MPDU subframes 400-K+1, . . . , 400-N.

The MPDU delimiters 410 and 450 included in the first A-MPDU subframes 400-1, 400-2, . . . , 400-k and the second A-MPDU subframes 400-K+1, . . . , 400-N may include information for positioning the MPDU in the A-MPDU frame. Further, according to the embodiment of the present invention, the MPDU delimiters 410 and 450 of the first A-MPDU subframes 400-1, 400-2, . . . , 400-k and the second A-MPDU subframes 400-K+1, . . . , 400-N may include FEC MPDU indication information configured by at least one bit. Hereinafter, the MPDU delimiter will be additionally described. A field of the A-MPDU frame which is not disclosed or simply described in the aforementioned embodiment of the present invention and an embodiment of the present invention to be described below may be analyzed as the same meaning as the field included in the A-MPDU frame defined in Clause 8.6 of IEEE draft 802.11ac D1.0.

As described above, according to the embodiment of the present invention, the data block included in the first A-MPDU subframe may include not a data block calculated by performing the FEC but only data transmitted on a higher layer of the actual MAC layer. That is, the data block of the first A-MPDU subframe as some blocks of the FEC encoded blocks described in FIG. 2 may be a block having an information amount to restore the data transmitted on the higher layer of the MAC layer or a block including only the data transmitted on the higher layer of the actual MAC layer. Accordingly, in the embodiment of the present invention, the data block may be analyzed as both meanings described above.

Figure 5:
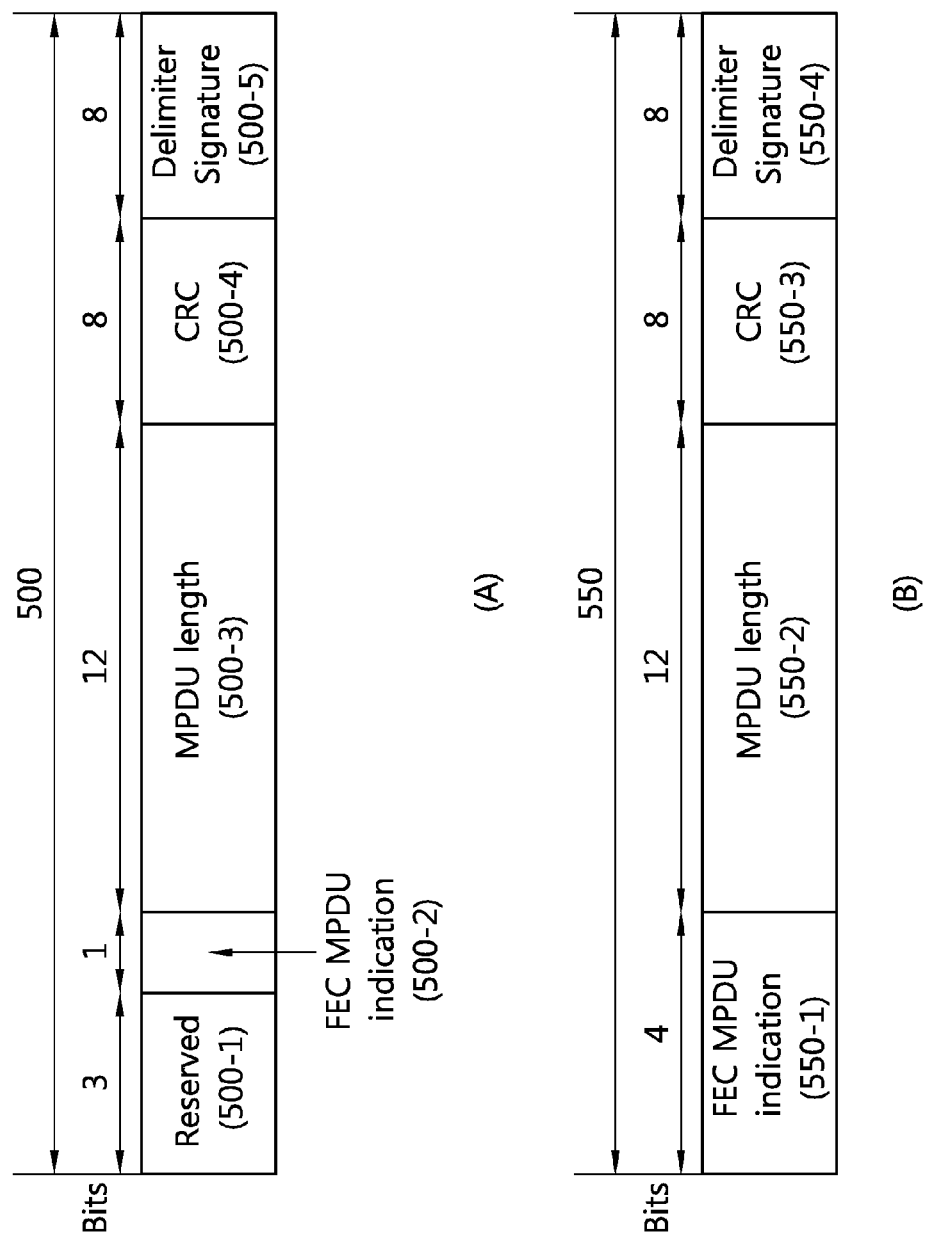
FIG. 5 is a conceptual diagram illustrating an MPDU delimiter according to an embodiment of the present invention.

FIG. 5 is a conceptual diagram illustrating an MPDU delimiter according to an embodiment of the present invention.

FIG. 5(A) illustrates a case in which the FEC MPDU indication information is configured by one bit, and the MPDU delimiter 500 may include reserved 500-1, FEC MPDU indication 500-2, an MPDU length 500-3, CRC 500-4, and a Delimiter Signature 500-5.

FIG. 5(B) illustrates a case in which the FEC MPDU indication information is configured by a plurality of bits, and the MPDU delimiter 550 may include FEC MPDU indication 550-1, an MPDU length 550-2, cyclical redundancy check (CRC) 550-3, and a Delimiter Signature 550-4.

The MPDU lengths 500-3 and 550-2 may represent length information of the MPDU of an octet unit and the CRCs 500-4 and 550-3 may include error detection information for bits of previous fields (reserved and MPDU length). The Delimiter Signature fields 500-5 and 550-4 may be used as pattern information for detecting the MPDU delimiter.

In a frame configuring method according to the embodiment of the present invention, the FEC MPDU indications 500-2 and 550-1 may be included in the MPDU delimiters 500 and 550 in order to distinguish the first A-MPDU subframe and the second A-MPDU subframe included in the A-MPDU frame. That is, it may be judged whether the A-MPDU subframe is the first A-MPDU subframe including the data block or whether the A-MPDU subframe is the second A-MPDU subframe including the FEC coding block in the MPDU based on the MPDU delimiters 500 and 550. As another embodiment, information on a mapping relationship between the first A-MPDU subframe and the second A-MPDU subframe may also be represented based on the MPDU delimiters 500 and 550.

The FEC MPDU indications 500-2 and 550-1 may use at least one bit. FIG. 5(A) illustrates a case in which the FEC MPDU indication 500-2 is expressed by using one bit and FIG. 5(B) illustrates a case in which the FEC MPDU indication 550-1 is expressed by using a plurality of bits. An additional embodiment for the cases in which the FEC MPDU indications 500-2 and 550-1 use one bit or a plurality of bits will hereinafter be additionally described in the embodiment of the present invention.

Tables 1 to 4 to be described below illustrate a mapping relationship between the FEC MPDU indication field and a definition of the field. The mapping relationship between the FEC MPDU indication field value and the definition of the field is arbitrary and the mapping relationship may be changed and the embodiment is also included in the scope of the present invention. In Tables 1 to 4, an A-MPDU subframe for data indicates a first subframe and an A-MPDU for FEC indicates a second subframe.

For example, in Tables 1 to 4 to be described below, the FEC MPDU indication may represent the relationship between the first A-MPDU subframe and the second A-MPDU subframe in the A-MPDU subframe by using methods described below.

(1) A method of indicating the first A-MPDU subframe and the second A-MPDU subframe by using one bit.

(2) A method of indicating the first A-MPDU subframe by using at least one bit, and indicating which first A-MPDU subframe the second A-MPDU subframe is an FEC coding block for.

(3) A method of indicating the first A-MPDU subframe by using at least one bit, and indicating which sub data block among a plurality of sub data blocks included in the first A-MPDU subframe the second A-MPDU subframe is FEC information for.

(4) A method of indicating the first A-MPDU subframe by using at least one bit, and indicating how many redundancy information the second A-MPDU subframe is in the first A-MPDU subframe. Hereinafter, the relationship will be disclosed in detail in the embodiment of the present invention.

Table 1 below is a table illustrating that the subframe is distinguished depending on a field value when the FEC MPDU indication uses one bit.

TABLE 1

| FEC MPDU indication (1 bit) | |
|---|---|
| Value | Description |
| 0 | A-MPDU subframe for Data |
| 1 | A-MPDU subframe for FEC |

Referring to Table 1, when the FEC MPDU indication value of the subframe is 0, the subframe may indicate the first A-MPDU subframe and when the FEC MPDU indication value is 1, the subframe may indicate the second A-MPDU subframe.

Figure 6:
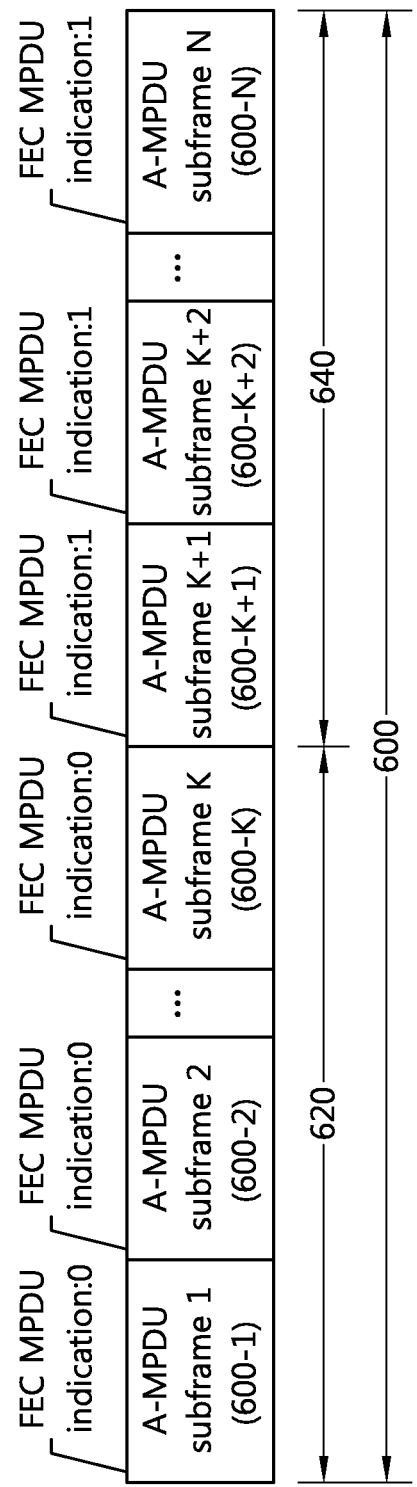
FIG. 6 is a conceptual diagram illustrating an A-MPDU frame according to an embodiment of the present invention.

FIG. 6 is a conceptual diagram illustrating an A-MPDU frame according to an embodiment of the present invention.

Referring to FIG. 6, it may be indicated whether a subframe included in an A-MPDU frame 600 is a first A-MPDU subframe 620 or a second A-MPDU subframe 640 by using the FEC MPDU indication described in Table 1.

When the number of A-MPDU subframes included in the A-MPDU frame 600 is N and the number of first A-MPDU subframes 600-1, 600-2, ..., 600-k among them is k, second A-MPDU subframes 600-k+1, 600-k+2, ..., 600-N may have N−k subframes. The second A-MPDU subframes 600-k+1, 600-k+2, ..., 600-N may be at least one subframe including the FEC coding blocks for the data blocks of k first A-MPDU subframes 600-1, 600-2, ..., 600-k when the number of the first A-MPDU subframes 600-1, 600-2, ..., 600-k is k (k is a natural number). For example, the FEC coding blocks for the data blocks of two first A-MPDU subframes 600-1 and 600-2 may be included in the one second A-MPDU subframe 600-k+1.

As described above in Table 1, k first A-MPDU subframes 600-1, 600-2, ..., 600-k may have 0 as the FEC indication field value and N−k second A-MPDU subframes 600-k+1, 600-k+2, . . . , 600-N may have 1 as the FEC indication field value.

As another embodiment using the FEC MPDU indication, the FEC MPDU indication may represent the mapping relationship between the first A-MPDU subframe and the second A-MPDU subframe by using a plurality of bits.

Table 2 below is a table illustrating a definition depending on the field value when the FEC MPDU indication uses a plurality of bits.

TABLE 2

FEC MPDU indication ($log_2K$ bit)

| Value | Description |
|---|---|
| 0 | A-MPDU subframe for Data |
| 1 | FEC A-MPDU subframe for A-MPDU subframe 1 |
| 2 | FEC A-MPDU subframe for A-MPDU subframe 2 |
| . | . |
| . | . |
| . | . |
| K | FEC A-MPDU subframe for A-MPDU subframe K |

Referring to Table 2, the FEC MPDU indication may have value of 0 to k. Each field value may indicate the first A-MPDU subframe and the second A-MPDU subframe.

For example, when the FEC MPDU indication of the subframe is 0, the subframe may mean the first A-MPDU subframe and when the FEC MPDU indication is 1 to k, the FEC MPDU indication may represent that the subframe represents a subframe including FEC coding blocks of a $1^{st}$ first A-MPDU subframe to k-th first A-MPDU subframe.

Figure 7:
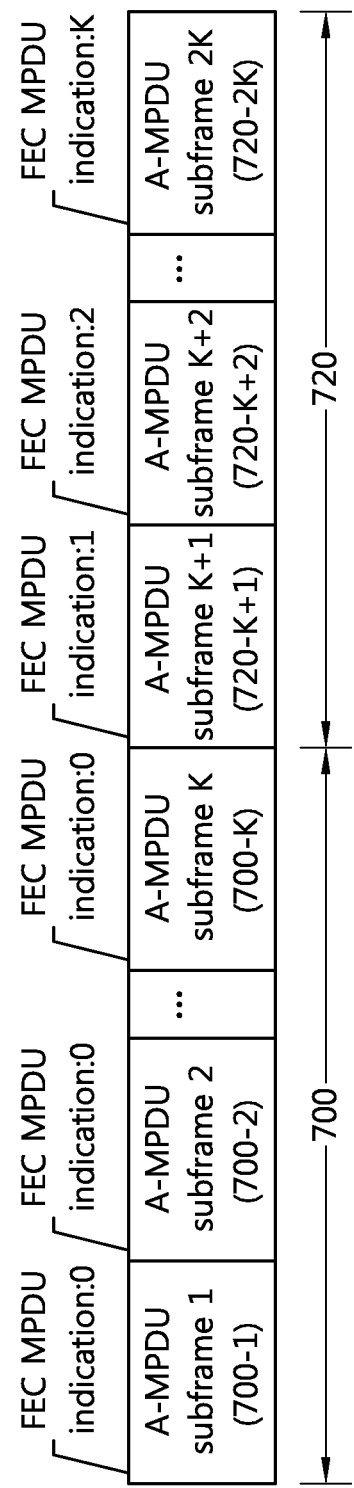
FIG. 7 is a conceptual diagram illustrating an A-MPDU frame according to an embodiment of the present invention.

FIG. 7 is a conceptual diagram illustrating an A-MPDU frame according to an embodiment of the present invention.

Referring to FIG. 7, the FEC MPDU indication described above in Table 2 may indicate a first A-MPDU subframe 700 and a second A-MPDU subframe 720.

When the number of first A-MPDU subframes 700-1, 700-2, . . . , 700-k is k, the number of second A-MPDU subframes 720-k+1, 720-k+2, . . . , 720-2k may also be k. FEC MPDU indication fields of k first A-MPDU subframes 700-1, 700-2, . . . , 700-k may have 0 and FEC MPDU indication fields of k second A-MPDU subframes 720-k+1, 720-k+2, . . . , 720-2k may have values of 1 to k in sequence.

As the mapping relation of Table 2, 1 to k which are the FEC MPDU indication values of the second A-MPDU subframes 720-k+1, 720-k+2, . . . , 720-2k may be used to indicate an FEC coding block of a $1^{st}$ first A-MPDU subframe 700-1 to an FEC coding block of k-th first A-MPDU subframe 7001 in sequence. For example, the FEC MPDU indication value of the second A-MPDU subframe 720-k+1 for the $1^{st}$ first A-MPDU subframe 7001 may be 1 and the FEC MPDU indication value of the second A-MPDU subframe 720-k+1 for a $2^{nd}$ first A-MPDU subframe 700-2 may be 2.

That is, second A-MPDU subframes 720-k+1, 720-k+2, . . . , 720-2k may be subframes including FEC coding blocks of k first A-MPDU subframes 700-1, 700-2, . . . , 700-k.

Table 3 below is a table illustrating a definition depending on the field value when the FEC MPDU indication uses a plurality of bits.

TABLE 3

FEC MPDU indication ($log_2B$ bit)

| Value | Description |
|---|---|
| 0 | A-MPDU subframe for Data |
| 1 | FEC A-MPDU subframe for 1st blocks of Data A-MPDU subframes |
| 2 | FEC A-MPDU subframe for 2nd blocks of Data A-MPDU subframes |
| . | . |
| . | . |
| . | . |
| K | FEC A-MPDU subframe for B-th blocks of Data A-MPDU subframes |

Referring to Table 3, the FEC MPDU indication may have values of 0 to k.

For example, when the FEC MPDU indication is 0, the first A-MPDU subframe may be represented. When the FEC MPDU indication is k, the second A-MPDU subframe in which the FEC coding blocks of k-th sub data blocks included in the first A-MPDU subframes are collected may be represented.

Figure 8:
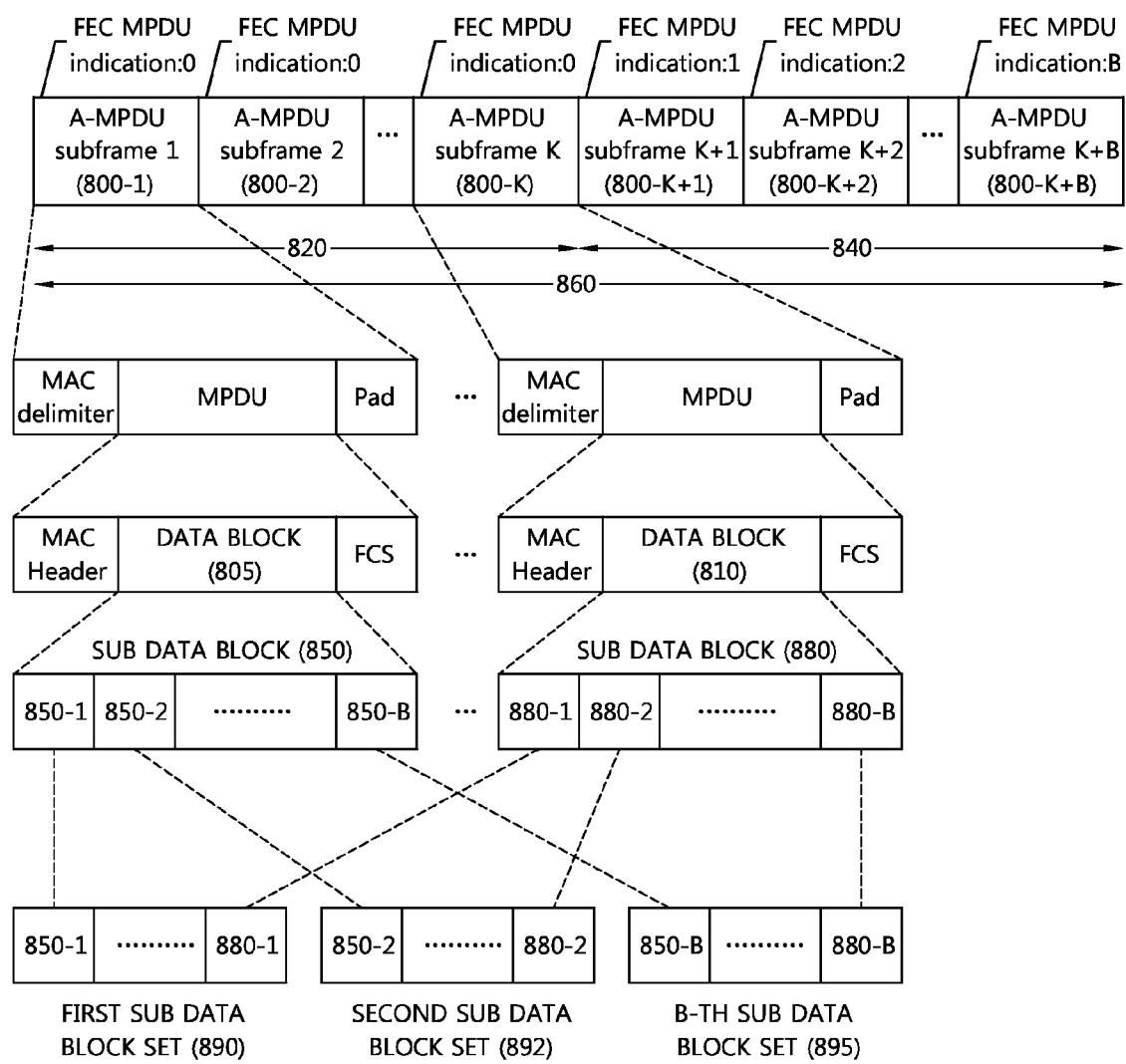
FIG. 8 is a conceptual diagram illustrating a first A-MPDU subframe divided into a plurality of sub data blocks according to an embodiment of the present invention.

FIG. 8 is a conceptual diagram illustrating a first A-MPDU subframe divided into a plurality of sub data blocks according to an embodiment of the present invention.

Referring to FIG. 8, a data block 810 included in the first A-MPDU subframes 800-1, 800-2, . . . , 800-k may be divided into a plurality of sub data blocks 810-1, 810-2, . . . , 810-B having predetermined sizes, and each of the sub data blocks 810-1, 810-2, . . . , 810-B may be specified by using a predetermined indicator.

Second A-MPDU subframes 800-k+1, 800-k+2, . . . , 800-k+B may include an FEC coding block for a set of respective sub data blocks 850, . . . , 880 included in the data block 810. For example, in the case where k first A-MPDU subframes 800-1, 800-2, . . . , 800-k exist in an A-MPDU frame 860, data blocks 805, . . . 810 included in the respective first A-MPDU subframes 800-1, 800-2, . . . , 800-k may be divided into a plurality of sub data blocks.

The $1^{st}$ second A-MPDU subframe 800-k+1 may be a subframe including the FEC coding block for a first sub data block set 890 which is a set of the first sub data blocks 850-1, . . . 880-1 of the data blocks 805, . . . 810 of the first A-MPDU subframes 800-k+1, 800-k+2, . . . , 800-k+B.

In the same manner, the $2^{nd}$ second A-MPDU subframe 800-k+2 may be a subframe including a FEC coding block for a second sub data block set 890 which is a set of the second sub data blocks 850-2, . . . 880-2 of the data blocks 805, . . . 810 of the first A-MPDU subframes 800-k+1, 800-k+2, . . . , 800-k+B. By this method, when the data block included in the first A-MPDU subframes 800-1, 800-2, . . . , 800-k is divided into B sub data blocks 810-1, 810-2, . . . , 810-B, the B sub data blocks may exist, and accordingly, B second A-MPDU subframes 800-k+1, 800-k+2, . . . , 800-k+B may be generated.

FIG. 8 illustrates one example of method of generating the second A-MPDU subframe by dividing the data block into the plurality of sub data blocks to generate the FEC coding block for the corresponding sub data block set. The number of sub data blocks included in one data block and the method of generating the second A-MPDU subframes by collecting the FEC coding block of the data block included in each of the first A-MPDU subframes may use another method other than the above method. For example, regardless of sequential arrangement of the sub data blocks included in each data block, one sub data block is selected, and the second A-MPDU subframe may be generated by using the FEC coding block for the selected sub data block. As another example, the FEC coding block included in the second A-MPDU subframe may display information regarding whether the FEC coding block for the selected sub data block is the FEC coding block for the sub data block of the data block included in any first A-MPDU subframe by using additional sub block indication information in the data block.

Referring back to FIG. 8, it is assumed that the data block of the first A-MPDU subframes 800-1, 800-2, . . . , 800-$k$ is divided into B sub data blocks. The k first A-MPDU subframes 800-1, 800-2, . . . , 800-$k$ may have 0 as an FEC MPDU indication value, and the remaining B second A-MPDU subframes 800-$k$+1, 800-$k$+2, . . . , 800-$k$+B may have values of 1 to B as the FEC MPDU indication value. For example, each of the second A-MPDU subframes 800-$k$+1, 800-$k$+2, . . . , 800-$k$+B may be a set of the FEC coding blocks of the sub data block having the same indication value as the FEC MPDU indication value. For example, n-th second A-MPDU subframe 800-$k$+n may be configured as the set of the FEC coding blocks of n-th sub data blocks 850-$n$, . . . , 880-$n$ included in the first A-MPDU subframes 800-1, 800-2, . . . , 800-$k$. If the number of first A-MPDU subframes is k, the k+n-th A-MPDU subframe may become the set of the FEC coding blocks of the n-th sub data block.

The following Table 4 is another Table illustrating definition according to a field value, in the case where the FEC MPDU indication uses a plurality of bits.

TABLE 4

| FEC MPDU indication (log$_2$R bit) | |
| --- | --- |
| Value | Description |
| 0 | A-MPDU subframe for Data |
| 1 | FEC A-MPDU subframe for 1st repetition of Data |
| 2 | FEC A-MPDU subframe for 2nd repetition of Data |
| . | . |
| . | . |
| . | . |
| R | FEC A-MPDU subframe For R-th repetition of Data |

Referring to Table 4, when the FEC MPDU indication is 0, the first A-MPDU subframe may be represented, and when the FEC MPDU indication has the values of 1 to R, how many repeated subframe of the first A-MPDU subframe a current subframe is may be represented.

When the FEC MPDU indication has a value of r, r-th redundancy of the first A-MPDU subframe is meant. For example, when the FEC MPDU indication is 1, the current subframe may represent a subframe acquired by first repeating the first 1 A-MPDU subframe.

Figure 9:
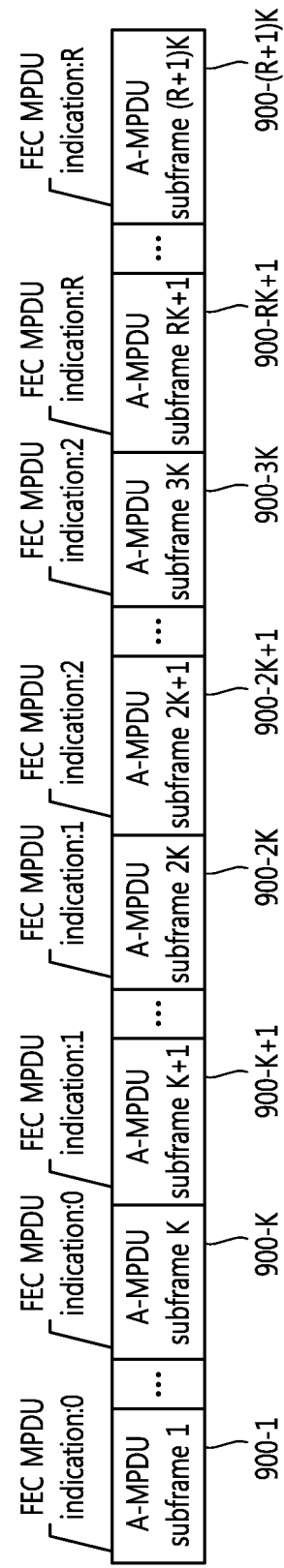
FIG. 9 is a conceptual diagram illustrating an A-MPDU frame according to an embodiment of the present invention.

FIG. 9 is a conceptual diagram illustrating an A-MPDU frame according to an embodiment of the present invention.

Referring to FIG. 9, an A-MPDU frame 900 may include k first A-MPDU subframes 900-1, . . . , 900-$k$, and may further include second A-MPDU subframes 900-$k$+1, . . . 900-2$k$, 900-2$k$+1, . . . 900-3$k$, 900-R$k$+1, . . . , 900-(R+1)$k$ repeated R times with respect to the k first A-MPDU subframes 900-1, . . . , 900-$k$. That is, the second AMPDU subframe may be the same subframe as the first AMPDU subframe.

The FEC MPDU indication value of the second A-MPDU subframes 900-$k$+1, . . . 900-2$k$, 900-2$k$+1, . . . 900-3$k$, 900-R$k$+1, . . . , 900-(R+1)$k$ may represent information on the number of repetition times regarding how many times the first A-MPDU subframes 900-1, . . . , 900-$k$ are repeated. For example, the second A-MPDU subframes 900-$k$+1, . . . , 900-2$k$ may have the FEC MPDU indication value of 1, and the second A-MPDU subframes 900-R$k$+1, . . . , 900-(R+1)$k$+1 may have the FEC MPDU indication value of R.

Hereinafter, in the embodiment of the present invention, a data transmission method when two STAs perform unicast in a WLAN environment will be described.

Hereinafter, in the embodiment of the present invention, for convenience of description, the method of transmitting the A-MPDU frame described in FIG. 6 is described, but the method and the apparatus of transmitting another A-MPDU frame structure described in FIGS. 4 to 9 are also included in the embodiment of the present invention.

Figure 10:
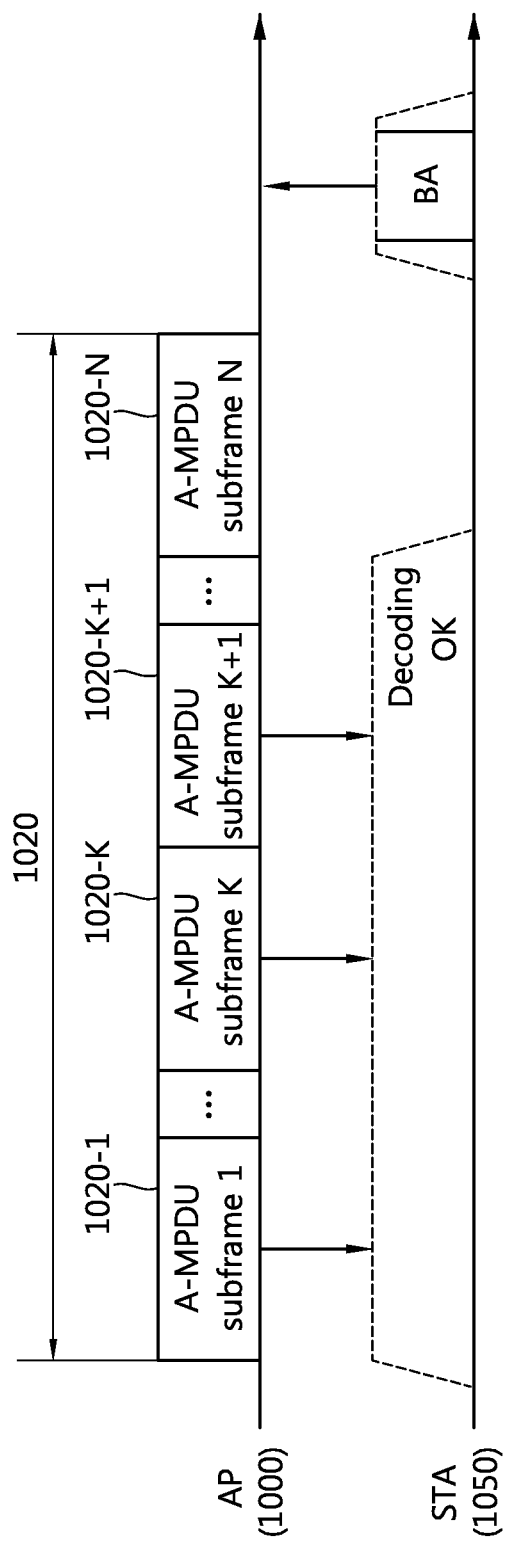
FIG. 10 is a conceptual diagram illustrating a unicast method of an A-MPDU frame according to an embodiment of the present invention.

FIG. 10 is a conceptual diagram illustrating a unicast method of an A-MPDU frame according to an embodiment of the present invention.

Referring to FIG. 10, an AP 1000 may transmit an A-MPDU frame 1020 to an STA 1050. The STA 1050 may receive the first A-MPDU subframes 1020-1, . . . , 1020-$k$ among the transmitted A-MPDU subframes. The STA 1050 may determine whether an error occurs or not in k first A-MPDU subframes 1020-1, . . . , 1020-$k$ received to the STA based on FCS information included in the received first A-MPDU subframes 1020-1, . . . , 1020-$k$. If the error does not occur in the received k first A-MPDU subframes 1020-1, . . . , 1020-$k$, the STA 1050 may not additionally receive the second A-MPDU subframes 1020-$k$+1, . . . , 1020-N, and transmits an ACK signal to the AP 1000 to feedback the transmitted ACK signal to the AP 1000.

In the case where the error occurs in at least one of the received k first A-MPDU subframes 1020-1, . . . , 1020-$k$, the STA 1050 additionally receives the second A-MPDU subframes 1020-$k$+1, . . . , 1020-N to perform error correction based on the FEC information included in the second A-MPDU subframes 1020-$k$+1, . . . , 1020-N. When the STA 1050 receives the second A-MPDU subframes 1020-$k$+1, . . . , 1020-N, all the second A-MPDU subframes 1020-$k$+1, . . . , 1020-N may not be received, but only some of the second A-MPDU subframes 1020-$k$+1, . . . , 1020-N may be received. For example, whenever the STA 1050 receives one second A-MPDU subframe 1020-$k$+1, the STA 1050 performs decoding for the first A-MPDU subframes 1020-1, . . . , 1020-$k$ again and determines whether the error exists or not again through the FCS. The STA does not additionally receive the second A-MPDU subframes 1020-$k$+2, . . . , 1020-N and transmits the ACK signal to feedback the transmitted ACK signal to the AP 1000, when the error does not exist in the first A-MPDU subframes 1020-1, . . . , 1020-$k$ by determining the error of the received first A-MPDU subframe.

Figure 11:
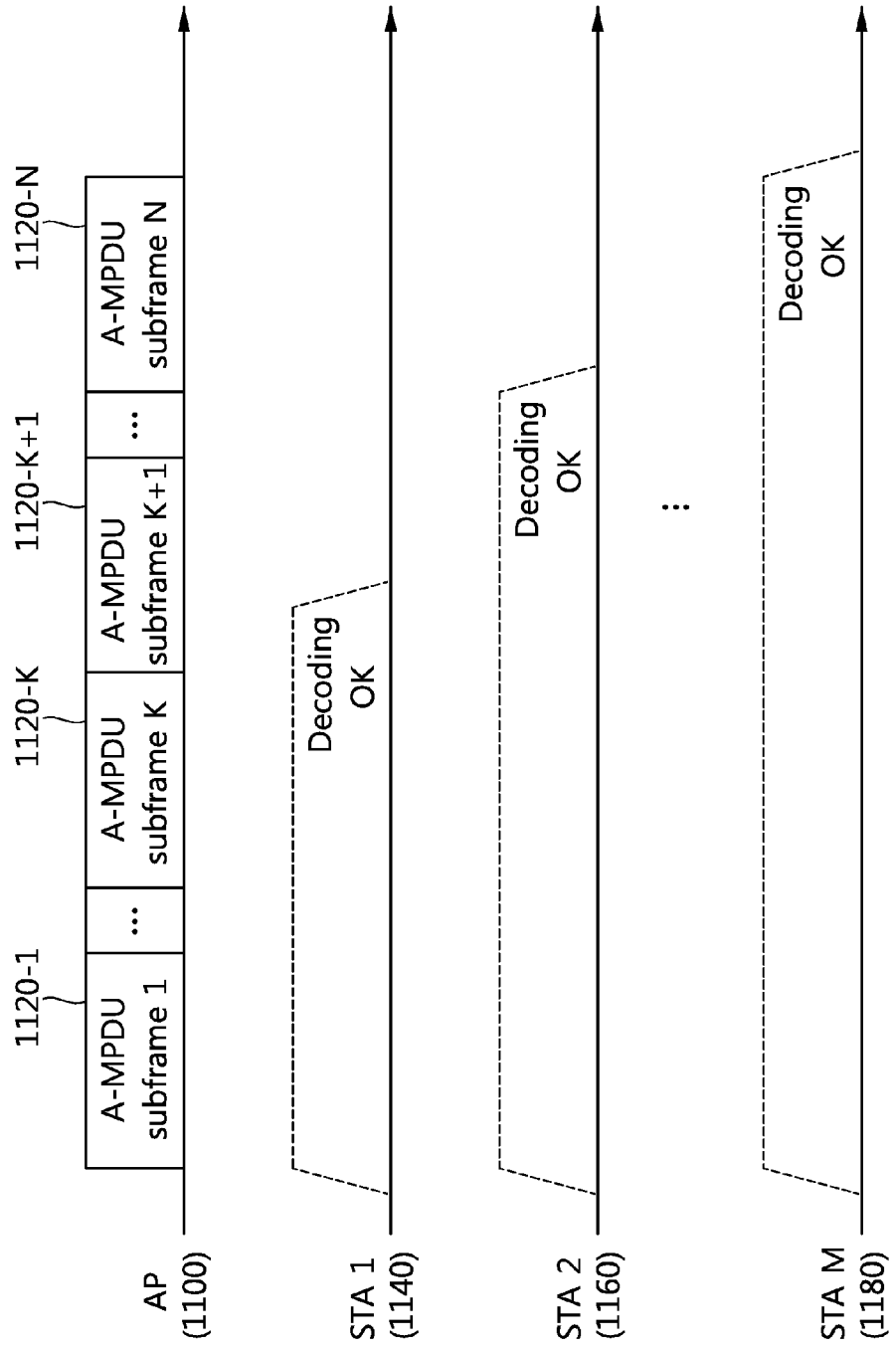
FIG. 11 is a conceptual diagram illustrating a broadcast/multicast method of an A-MPDU frame according to an embodiment of the present invention.

FIG. 11 is a conceptual diagram illustrating a broadcast/multicast method of an A-MPDU frame according to an embodiment of the present invention.

Referring to FIG. 11, an AP 1100 may transmit an A-MPDU frame 1120 to a plurality of STAs STA1 1140, STA2 1160, . . . STAM 1180.

In the case of the STA1 1140, since the error does not occur in the transmitted first A-MPDU subframes 1120-1, . . . , 1120-$k$, the STA1 1140 may enter into a sleep mode without additionally receiving the second A-MPDU subframes 1120-$k$+1, . . . , 1120-N including the FEC information.

In the case of the STA2 1160 and the STA3 1180, since the error occurs in the transmitted first A-MPDU subframes

1120-1, . . . , 1120-*k*, in order to additionally receive the FEC information, the STA2 1160 and the STA3 1180 may received some of the second A-MPDU subframes 1120-*k*+1, . . . , 1120-N and perform decoding again based on the received second A-MPDU subframes 1120-*k*+1, . . . , 1120-N, and then when the error is not detected in the decoded first A-MPDU subframe, the STA2 1160 and the STA3 1180 may enter into the sleep mode. In the case where the error still exists in the decoded first A-MPDU subframe, at least one subframe of the second A-MPDU subframes 1120-*k*+1, . . . , 1120-N may be additionally received.

That is, even in the case of the unicast and the broadcast and multicast, the degree of the error occurrence may vary according to an external factor such as a channel state of the STA, and the second A-MPDU subframe received by the STA is differently determined according to the error degree received to the STA by using the A-MPDU frame transmission method according to the embodiment of the present invention, thereby reducing power consumption of the STA.

That is, it is possible to prevent power consumption of the STA for unnecessary data transmission by using the method of FIGS. 10 and 11 described above.

Figure 12:
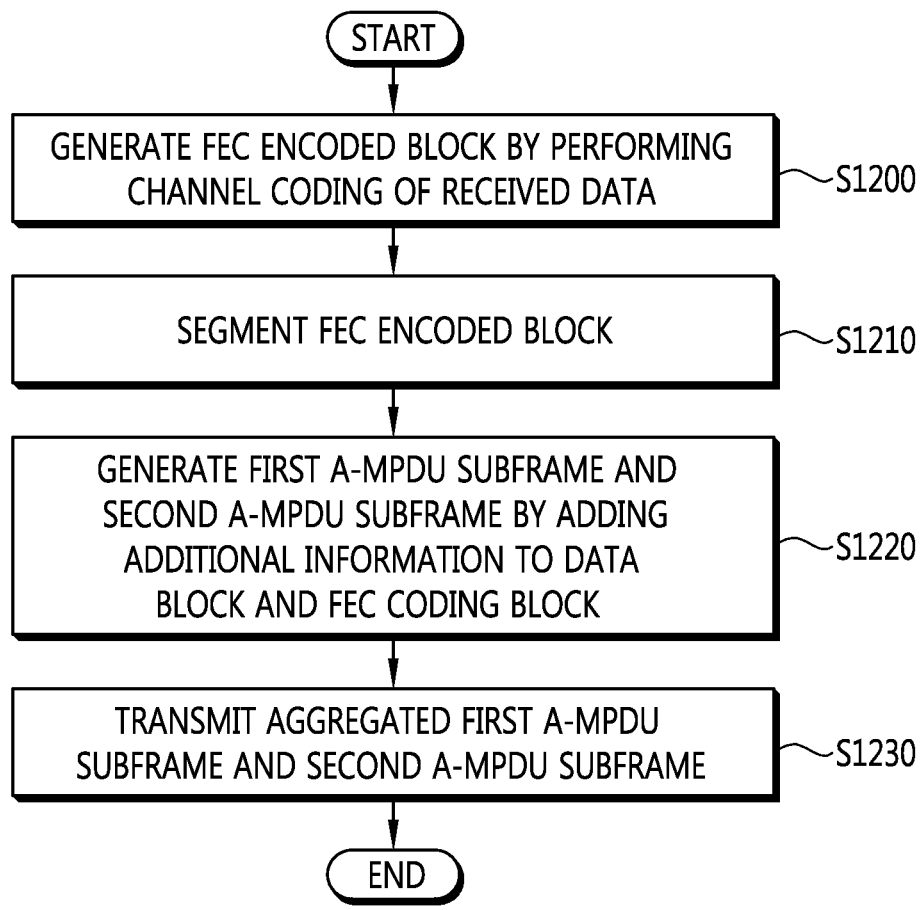
FIG. 12 is a conceptual diagram illustrating a method for transmitting a frame according to an embodiment of the present invention.

FIG. 12 is a conceptual diagram illustrating a method for transmitting a frame according to an embodiment of the present invention.

Referring to FIG. 12, an FEC encoded block is generated by performing channel coding such as FEC with respect to the received data (step S1200).

The data may designate, for example, an MSDU which is data transmitted from a MAC upper layer. With respect to the data, the FEC coding is performed to generate an FEC encoded block. The FEC encoded block may be a block in which a data component and error correction information such as a parity bit calculated by performing the FEC are divided, or one FEC encoded block in which the data component is not divided.

The FEC encoded block is segmented (step S1210).

The FEC encoded block may be segmented by a predetermined decodable unit in a receiving terminal. The predetermined decodable unit in the receiving terminal may be referred to as a data block. The remaining FEC encoded block except for the data block may be referred to as an FEC coding block.

The first A-MPDU subframe and the second A-MPDU subframe are generated by adding additional information to the data block and the FEC coding block (step S1220).

An MPDU delimiter may be included in the first A-MPDU subframe and the second A-MPDU subframe. The MPDU delimiter may include FEC MPDU indication information, and the FEC MPDU indication information may be shown a relationship between the first A-MPDU subframe and the second A-MPDU subframe. A method of generating the second A-MPDU subframe with respect to the data block of the first A-MPDU subframe may use the method illustrated in FIGS. 4 to 9 described above.

The aggregated first A-MPDU subframe and second A-MPDU subframe is transmitted (step S1230).

The first A-MPDU subframe and the second A-MPDU subframe generated through the above step may be transmitted to the STA.

An A-MPDU frame transmitting terminal may additionally receive information regarding that an error does not occur in the A-MPDU frame which is received from the STA receiving the A-MPDU frame.

The order of the steps of FIG. 12 is not particularly sequential, and the steps may be implemented even in a changed order, and as a result, the order of the steps may be changed. Further, two steps may be performed as one step.

That is, the steps of generating the first A-MPDU subframe and the second A-MPDU subframe may be also performed in parallel, not in sequential.

Figure 13:
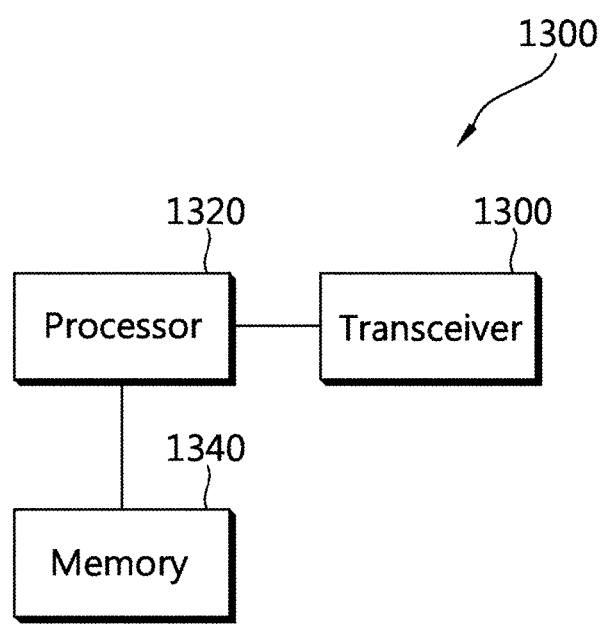
FIG. 13 is a block diagram illustrating a wireless device to which the embodiment of the present invention can be applied.

FIG. 13 is a block diagram illustrating a wireless device to which the embodiment of the present invention can be applied. A wireless apparatus 1300 may be an AP or a non-AP station, as an apparatus capable of implementing the above embodiments.

The wireless apparatus 1300 may include a processor 1320, a memory 1340, and a transceiver 1360. The transceiver 1360 transmits/receives a wireless signal, and a physical layer of IEEE 802.11 is implemented. The processor 1320 is functionally connected to the transceiver 1360 to implement an MAC layer and a physical layer of IEEE 802.11. The processor 1320 may generate the first A-MPDU subframe and the second A-MPDU subframe proposed by the present invention.

The processor 1320 of the transmitting terminal may generate the data block and the FEC coding block described above. The method of generating the data block and the FEC coding block may use the method illustrated in FIGS. 3 to 12 described above.

The processor 1320 may restore an error existing the first A-MPDU based on the received first A-MPDU subframe and second A-MPDU subframe. The processor 1320 may be set to implement the embodiments of the present invention described above.

The transceiver 1360 may transmit a frame generated based on the A-MPDU frame including the first A-MPDU subframe and the second A-MPDU subframe in the MAC layer.

The processor 1320 and/or the transceiver 160 may include an application-specific integrated circuit (ASIC), another chip set, a logic circuit and/or a data processing apparatus. The memory 1340 may include a read-only memory (ROM), a random access memory (RAM), a flash memory, a memory card, a storage medium, and/or another storage device. When the embodiment is implemented by software, the aforementioned technique may be implemented by a module (a process, a function, and the like) that performs the aforementioned function. The module may be stored in the memory 1340 and executed by the processor 1320. The memory 1340 may be provided inside or outside the processor 1320 and connected with the processor 1320 by various well-known means.

The invention claimed is:

1. A method for transmitting a frame, the method comprising:
    generating an aggregate MAC protocol data unit (A-MPDU) including a first A-MPDU subframe and a second A-MPDU subframe; and
    transmitting the A-MPDU,
    wherein the first A-MPDU subframe includes a data block which is divided into a first sub data block and a second sub data block,
    wherein the second A-MPDU subframe includes a forward error correction (FEC) coding block additionally used to decode the data block,
    wherein each of the first A-MPDU subframe and the second A-MPDU subframe includes an FEC MPDU indication for distinguishing the first A-MPDU subframe and the second A-MPDU subframe by using a first bit, a second bit and a third bit,
    wherein the first bit is used to indicate the first A-MPDU subframe, wherein the second bit is used to indicate the second A-MPDU subframe including a FEC coding block for the first sub data block, and wherein the third bit is used to indicate the second A-MPDU subframe including a FEC coding block for the second sub data block.

2. The method of claim 1,
wherein the second A-MPDU subframe is at least one subframe including FEC coding blocks for data blocks of k first A-MPDU subframes when the number of first A-MPDU subframes is k (k is a natural number).

3. The method of claim 1,
wherein the second A-MPDU subframe is a subframe including FEC coding blocks for data blocks included in k respective first A-MPDU subframes when the number of first A-MPDU subframes is k (k is the natural number).

4. The method of claim 1,
wherein the second A-MPDU subframe is the same subframe as the first A-MPDU subframe.

5. An AP for transmitting a frame, the AP comprising:
a transceiver that transmits and receives a radio signal; and
a processor operating in functional association with the transceiver, wherein the processor:
  generates an aggregate MAC protocol data unit (A-MPDU) including a first A-MPDU subframe and a second A-MPDU subframe; and
  transmits the A-MPDU,
wherein the first A-MPDU subframe includes a data block which is divided into a first sub data block and a second sub data block,
wherein the second A-MPDU subframe includes a forward error correction (FEC) coding block additionally used to decode the data block,
wherein each of the first A-MPDU subframe and the second A-MPDU subframe includes an FEC MPDU indication for distinguishing the first A-MPDU subframe and the second A-MPDU subframe by using a first bit, a second bit and a third bit,
wherein the first bit is used to indicate the first A-MPDU subframe,
wherein the second bit is used to indicate the second A-MPDU subframe including a FEC coding block for the first sub data block, and
wherein the third bit is used to indicate the second A-MPDU subframe including a FEC coding block for the second sub data block.

6. The AP of claim 5,
wherein the second A-MPDU subframe is at least one subframe including FEC coding blocks for data blocks of k first A-MPDU subframes when the number of first A-MPDU subframes is k (k is a natural number).

7. The AP of claim 5,
wherein the second A-MPDU subframe is a subframe including FEC coding blocks for data blocks included in k respective first A-MPDU subframes when the number of first A-MPDU subframes is k (k is the natural number).

8. The AP of claim 5,
wherein the second A-MPDU subframe is the same subframe as the first A-MPDU subframe.

* * * * *